(12) United States Patent
Shyu

(10) Patent No.: US 7,553,712 B2
(45) Date of Patent: Jun. 30, 2009

(54) METHOD FOR MANUFACTURING A BOTTOM SUBSTRATE OF A LIQUID CRYSTAL DISPLAY

(75) Inventor: Wen-Yih Shyu, Hsin-Chu (TW)

(73) Assignee: AU Optronics Corp. (TW)

( * ) Notice: Subject to any disclaimer, the term of this patent is extended or adjusted under 35 U.S.C. 154(b) by 420 days.

(21) Appl. No.: 11/643,869

(22) Filed: Dec. 22, 2006

(65) Prior Publication Data

US 2007/0196941 A1    Aug. 23, 2007

(30) Foreign Application Priority Data

Feb. 22, 2006    (TW) .............................. 95105941 A

(51) Int. Cl.
*H01L 21/84*    (2006.01)
(52) U.S. Cl. ................. 438/160; 257/E21.414
(58) Field of Classification Search ............... 438/159, 438/160; 257/E21.414
See application file for complete search history.

(56) References Cited

U.S. PATENT DOCUMENTS

| 6,335,211 | B1 | 1/2002 | Lee |
| 6,440,784 | B2 * | 8/2002 | Lee ............................ 438/161 |
| 6,605,494 | B1 * | 8/2003 | Park et al. ................... 438/160 |
| 6,674,093 | B1 | 1/2004 | Tanaka et al. |
| 6,917,392 | B2 | 7/2005 | Hannuki et al. |

FOREIGN PATENT DOCUMENTS

JP    7086611    3/1995

* cited by examiner

*Primary Examiner*—Chandra Chaudhari
(74) *Attorney, Agent, or Firm*—Bacon & Thomas, PLLC

(57) ABSTRACT

A method for manufacturing a bottom substrate of a liquid crystal display device is disclosed. The method is achieved by proceeding two lithography processes cycles with a single mask. Therefore, the method of the present invention can manufacture a bottom substrate through five lithography processes cycles with only four masks. Thus, the cost of a liquid crystal display device can be reduced due to the absence of the manufacturing cost of one mask.

19 Claims, 4 Drawing Sheets

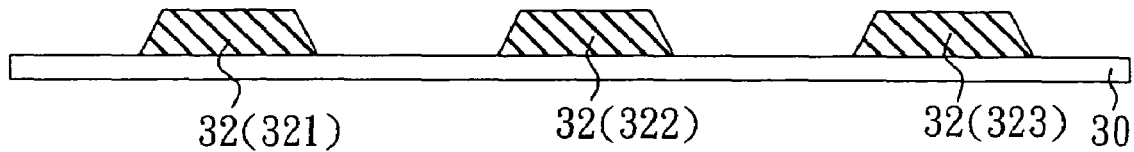
FIG. 1a (PRIOR ART)
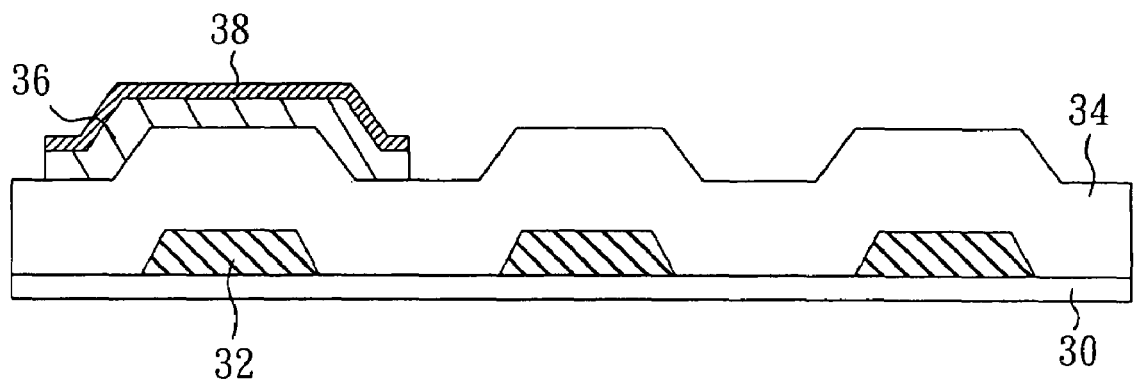
FIG. 1b (PRIOR ART)
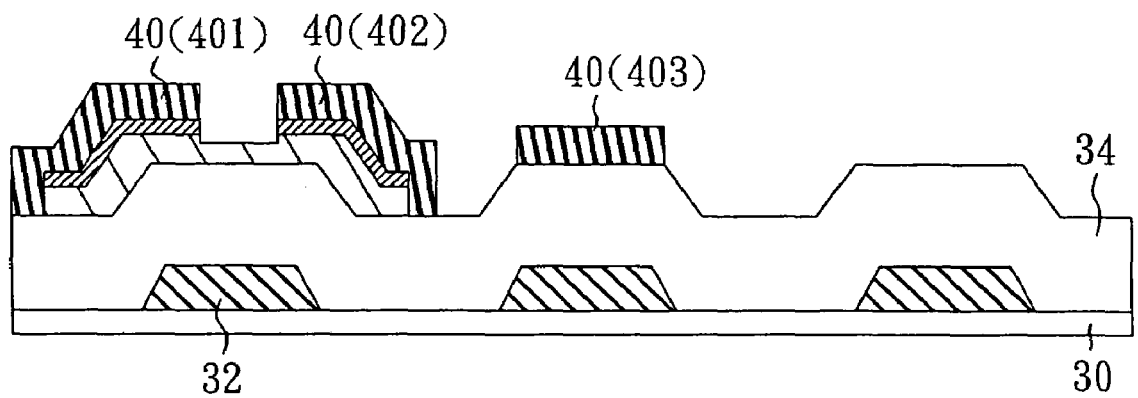
$32\begin{cases}321\\322\\323\end{cases}$  $40\begin{cases}401\\402\\403\end{cases}$   FIG. 1c (PRIOR ART)

METHOD FOR MANUFACTURING A BOTTOM SUBSTRATE OF A LIQUID CRYSTAL DISPLAY

BACKGROUND OF THE INVENTION

1. Field of the Invention

The present invention relates to a method for manufacturing a bottom substrate of a liquid crystal display device and, more particularly, to a method for manufacturing a bottom substrate of a thin film transistor liquid crystal display device (TFT-LCD).

2. Description of Related Art

Compared with the conventional cathode ray tube monitor, the liquid crystal display device has the advantages of low power consumption, compact size, and non-radiation. However, the manufacturing of the liquid crystal display device is relatively complex and costly. In particular, the number of masks needed in the photolithography and etching processes can not be reduced effectively. As a result, the manufacturing cost of the thin film transistor array can not be further decreased yet.

In general, the manufacturing process of the thin film transistor array uses five masks to carry out the photolithography and etching processes and thus define the components of the thin film transistor array. With reference to FIGS. 1a to 1e, the first mask is used to pattern the first metal layer and then form the patterned first metal layer 32, which includes a gate electrode 321 of a thin film transistor, a bottom electrode 322 of an auxiliary capacitor, and the terminal pad 323. The second mask is used to define the semiconductor layer 36 and the ohmic contact layer 38 of the thin film transistor, as shown in FIG. 1b.

Comparing the shape and position of the patterned first metal layer 32 in FIG. 1a and that of the semiconductor layer 36 and the ohmic contact layer 38, it is obvious that the pattern of the first mask is different from that of the second mask. This means the first photolithography and etching process and the second photolithography and etching process can not use the same mask.

Next, the third mask is used to pattern the second metal layer 40 and thus form the patterned second metal layer 40, as shown in FIG. 1c. The patterned second metal layer 40 comprises a source electrode 401 and a drain electrode 402 of the thin film transistor, and a top electrode 403 of the auxiliary capacitor. The fourth mask, as shown in FIG. 1d, is used to pattern the planar layer 44 and the passivation layer 42. Consequently, a contact of drain electrode 511 or a contact of terminal pad 512 is formed. It is possible to form the passivation layer 42 only, the planar layer 44 only, or both the passivation layer 42 and the planar layer 44. If both the passivation layer 42 and the planar layer 44 are formed, the sequence of the passivation layer 42 and the planar layer 44 is not limited. Next, as shown in FIG. 1e, the fifth mask is utilized to pattern the transparent conductive layer 46 and form the pixel electrode. As the shape and the position of the various components defined by the five photolithography and etching processes are different, it is necessary to use five masks for manufacturing the thin film transistor array.

However, the manufacturing cost of the mask becomes more and more expensive due to the increasing size of the thin film transistor liquid crystal display (TFT-LCD). Therefore, it is desirable to provide an improved method to mitigate and/or obviate the aforementioned problems.

SUMMARY OF THE INVENTION

The method of the present invention can manufacture a bottom substrate of a liquid crystal display device through five lithography processes cycles with only four masks. Thus, the cost of a liquid crystal display device can be reduced due to the absence of the manufacturing cost of one mask. Moreover, the mask alignment error can also be reduced due to the absence of one mask, and the yield can thus be improved.

To achieve the object, the method for manufacturing a bottom substrate of a liquid crystal display according to the present invention comprises the steps of: (A) providing a substrate; (B) forming a first metal layer on the substrate, and then patterning the first metal layer by using a first mask; (C) forming a first insulating layer on the first metal layer and the substrate; (D) forming a semiconductor layer on the first insulating layer, and then patterning the semiconductor layer by using the first mask, wherein the semiconductor layer is above the first metal layer; (E) forming a second metal layer on the semiconductor layer, and then patterning the second metal layer; (F) forming a second insulating layer on the second metal layer, the semiconductor layer and the first insulating layer, and then patterning the second insulating layer; and (G) forming a transparent electrode layer on the second insulating layer and then patterning the transparent electrode layer.

The pattern of the first metal layer is the same as that of the semiconductor layer, so the first and the second photolithography and etching processes cycles are carried out by using the same mask in the present invention. Therefore, the method of the present invention utilizes only four masks to carry out five photolithography and etching processes, and the design and manufacturing cost of the omitted mask is thus saved.

In addition, because the pattern of the first metal layer is the same as that of the semiconductor layer, the patterned first metal layer can be further taken as a mask to carry out a second photolithography and etching process on the semiconductor layer. Similarly, the design and manufacturing cost of the replaced mask is saved. The present invention also provides another method for manufacturing a bottom substrate of a liquid crystal display, which comprises the steps of: (A) providing a substrate; (B) forming a first metal layer on the substrate, and then patterning the first metal layer by using a first mask; (C) forming a first insulating layer on the first metal layer and the substrate; (D) forming a semiconductor layer on the first insulating layer, and then patterning the semiconductor layer by using the first mask, wherein the semiconductor layer is above the first metal layer; (E) forming a second metal layer on the semiconductor layer, and then patterning the second metal layer; (F) forming a second insulating layer on the second metal layer, the semiconductor layer and the first insulating layer, and then patterning the second insulating layer; and (G) forming a transparent electrode layer on the second insulating layer and then patterning the transparent electrode layer. Thus, the number of masks used in the method of the present invention is reduced relative to the prior art.

In the method for manufacturing a bottom substrate of a liquid crystal display of the present invention, the second insulating layer above the second metal layer can be composed of a passivation layer, a planar layer, or both the passivation layer and the planar layer. If the second insulating layer is composed of the passivation layer and the planar layer, it is not limited in their sequence. Preferably, the second insulating layer is composed of both the passivation layer and the planar layer, so as to increase the yield of the bottom substrate and to improve the display performance of the liquid crystal display device.

It is optional to form an ohmic contact layer on the semiconductor layer for reducing the resistance between the semiconductor layer and the second metal layer in the method of the present invention. The semiconductor layer can be any conventional semiconductor layer used in the thin film transistor. Preferably, the semiconductor layer is an amorphous silicon layer. The ohmic contact layer can be any conventional ohmic contact layer used in the semiconductor. Preferably, the ohmic contact layer is an $N^+$ amorphous silicon layer.

In the method of the present invention, the second insulating layer can be patterned by any conventional method. Preferably, the second insulating layer is patterned by the photolithography and etching method. The second insulating layer is optional to have a plurality of through holes. Among these through holes, at least one through hole extends through both the second insulating layer and the first insulating layer, so as to expose the first metal layer. Thus, the exposed first metal layer can serve as a contact of the terminal pad for the bottom substrate. Alternatively, at least one through hole may extend through the second insulating layer, so as to expose the second metal layer. The exposed second metal layer may serve as a contact of drain electrode for the bottom substrate.

In the method of the present invention, the first metal layer may construct various components of the thin film transistor. Preferably, part of the first metal layer serves as the gate electrode of the thin film transistor, part of the first metal layer serves as an electrode of an auxiliary capacitor, or part of the first metal layer serves as a terminal pad outside of the display area. In the method of the present invention, the second metal layer may construct various components of the thin film transistor. Preferably, part of the second metal layer serves as a source electrode or a drain electrode of the thin film transistor. In the method of the present invention, the substrate may be any conventionally used substrate. Preferably, the substrate is a glass substrate. In the method of the present invention, the insulating layer may be made of any conventional material. Preferably, the insulating layer is made of silicon oxide or silicon nitride. In the method of the present invention, the transparent electrode layer may be made of any metal oxide. Preferably, the transparent electrode layer is made of indium zirconium oxide (IZO) or indium tin oxide (ITO).

Other objects, advantages, and novel features of the invention will become more apparent from the following detailed description when taken in conjunction with the accompanying drawings.

BRIEF DESCRIPTION OF THE DRAWINGS

FIGS. 1a to 1e are schematic cross-sectional views showing the processes of manufacturing the bottom substrate of a liquid crystal display of the prior art.

DETAILED DESCRIPTION OF THE PREFERRED EMBODIMENT

Figure 1D:
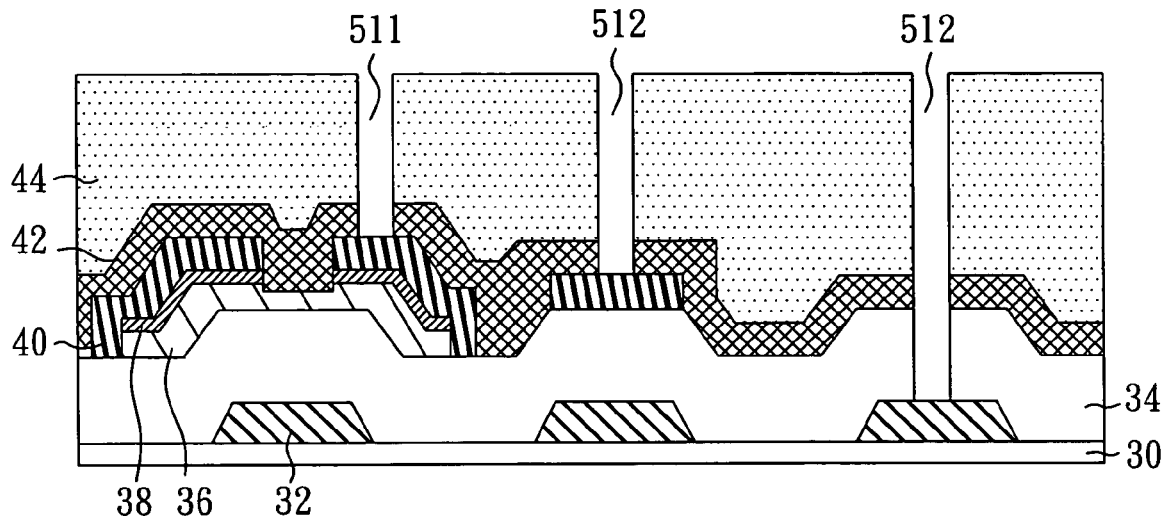
Figure 1E:
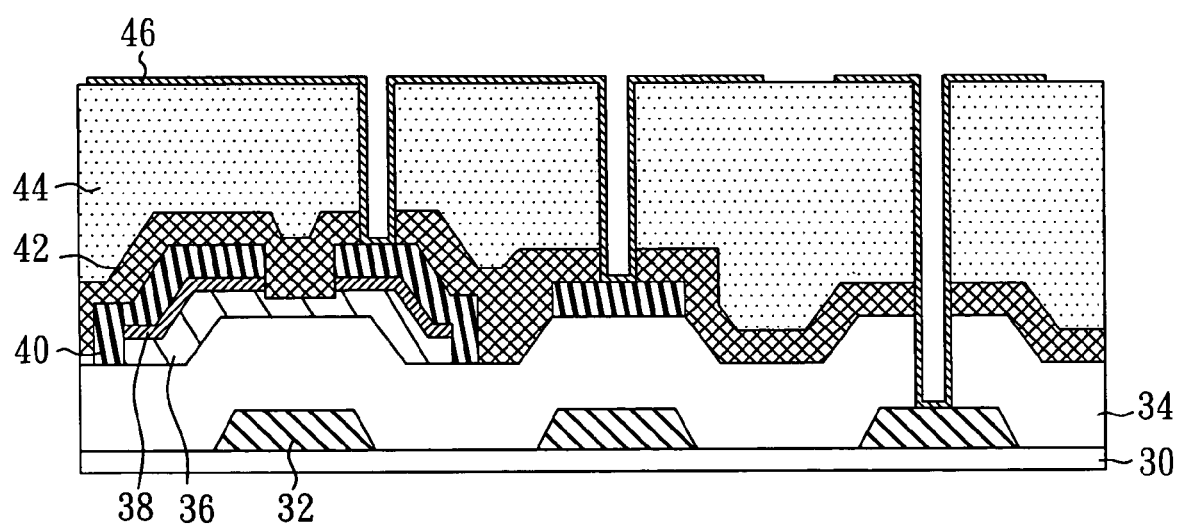
Figure 2A:
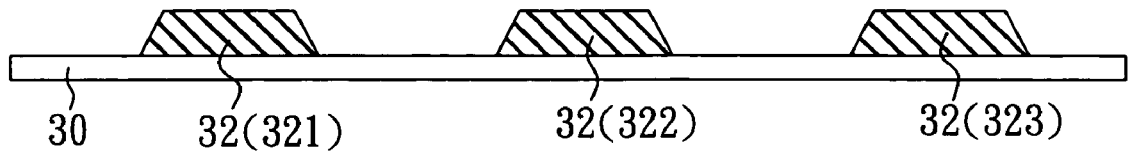
FIGS. 2a to 2e are schematic cross-sectional views showing the processes of manufacturing the bottom substrate of a liquid crystal display of the present invention.
Figure 2B:
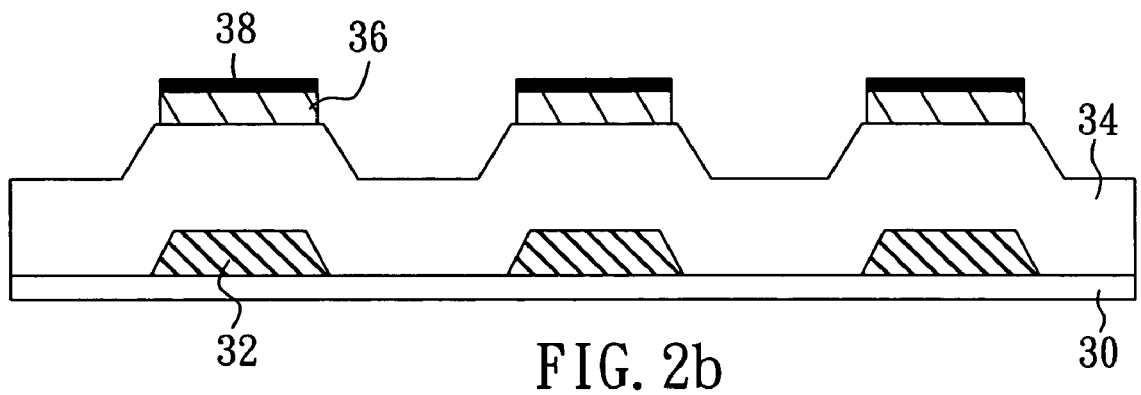

With reference to FIGS. 2a to 2b, these are schematic cross-sectional views showing the processes of the embodiment of the present invention.

First, a substrate 30 is provided, as shown in FIG. 2a. The substrate 30 may be a glass substrate, a quartz substrate, or a plastic substrate. Next, a first metal layer (not shown) is formed on the substrate 30, and then the first metal layer is patterned by the photolithography and etching methods using a first mask. In other words, after the first metal layer is formed, a patterned photoresist (not shown) is deposited thereon, and then the first metal layer is etched by dry or wet etching to form a patterned first metal layer 32. In the present embodiment, the patterned first metal layer 32 includes a gate electrode 321 of a thin film transistor, a bottom electrode 322 of an auxiliary capacitor, and a terminal pad 323 outside of a display area. In addition, the patterned first metal layer 32 may have a single layer structure or a multi-layer structure. The material of the patterned first metal layer 32 may be a metal or alloy. Preferably, the patterned first metal layer 32 is made of aluminum (Al), tungsten (W), chromium (Cr), copper (Cu), titanium (Ti), titanium nitride (TiNx), aluminum alloy, chromium alloy, molybdenum (Mo), or the combinations thereof.

After that, a first insulating layer 34 is formed over the substrate 30 and the patterned first metal layer 32, as shown in FIG. 2b. Afterwards, a semiconductor layer (not shown) and an ohmic contact layer (not shown) are sequentially deposited over the first insulating layer 34. Next, the semiconductor layer and the ohmic contact layer are patterned by the photolithography and etching methods using the first mask. As a result, the patterned semiconductor layer 36 and the patterned ohmic contact layer 38 are formed directly above the patterned first metal layer 32 and have the same pattern as the patterned first metal layer 32. In the present embodiment, the first insulating layer 34 may be made of silicon oxide (SiOx), silicon nitride (SiNy), or Silicon oxynitride, the patterned semiconductor layer 36 may be made of amorphous silicon or polycrystalline silicon, and the patterned ohmic contact layer 38 may be made of doped semiconductor, e.g. n-type doped silicon.

In other words, one mask can be omitted due to the coincidence of the pattern between the first metal layer 32 and the semiconductor layer 36 (the ohmic contact layer 38). Therefore, the design and manufacturing cost of the omitted mask can be saved.

In another embodiment, the patterned first metal layer 32 can also serve as the mask in the backside exposure because the patterns of the patterned first metal layer 32, the patterned semiconductor layer 36, and the patterned ohmic contact layer 38 are identical. Thus, as the semiconductor layer, and the ohmic contact layer are patterned by photolithography and etching methods, the patterned first metal layer 32 can serve as the mask in the backside exposure. Similarly, the design and manufacturing cost of the omitted mask can also be saved.

Figure 2C:
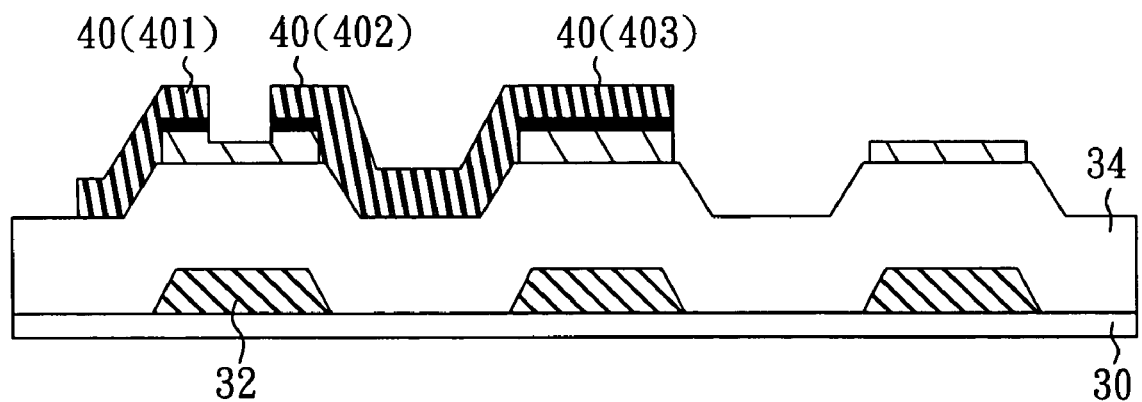
Figure 2D:
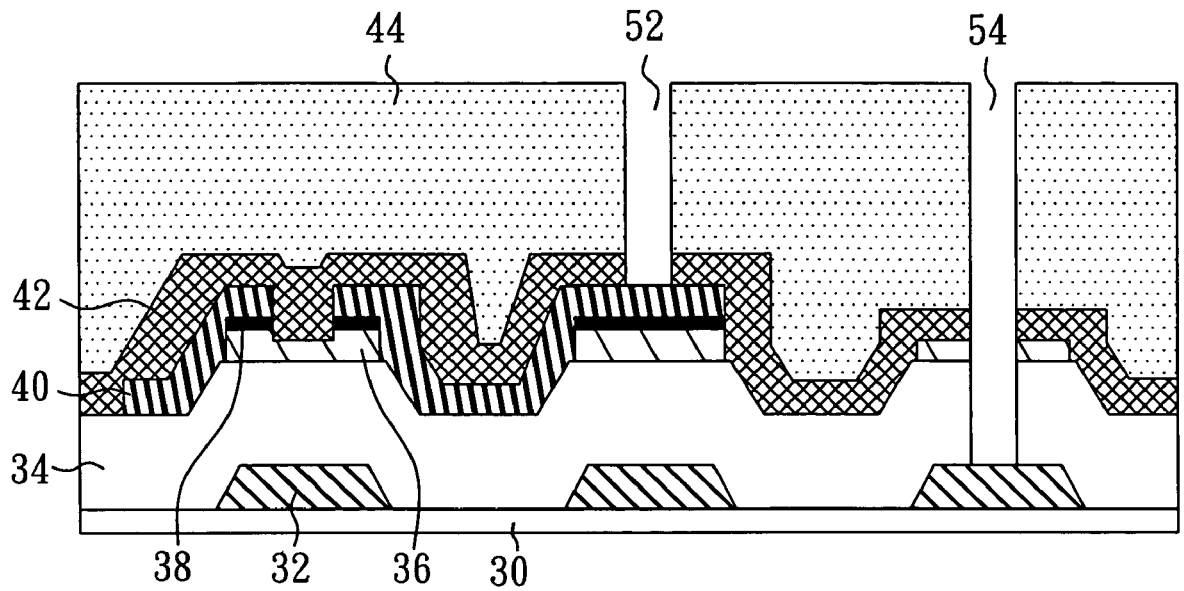
Figure 2E:
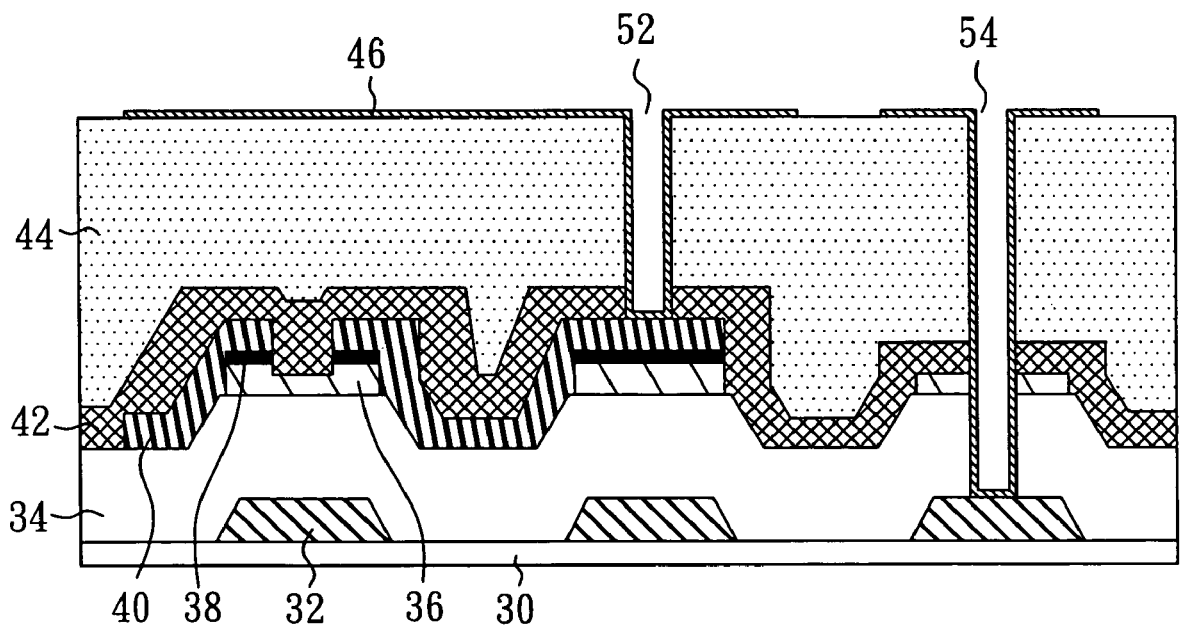

Next, a second metal layer is formed on the semiconductor layer 36 and the insulating layer 34, as shown in FIG. 2c. Afterwards, a second mask (not shown) is used to pattern the second metal layer to form a patterned second metal layer 40. The patterned second metal layer 40 includes a source electrode 401 and a drain electrode 402 of the thin film transistor, and a top electrode 403 of the auxiliary capacitor. Similar to the patterned first metal layer 32, the patterned second metal layer 40 may have a single layer structure or a multi-layer structure. The material of the patterned second metal layer 40 may be a metal or alloy. Preferably, the patterned second metal layer 40 is made of aluminum (Al), tungsten (W), chromium (Cr), copper (Cu), titanium (Ti), titanium nitride (TiNx), aluminum alloy, chromium alloy, molybdenum (Mo), or the combinations thereof. The patterned ohmic contact layer 38 and a part of the patterned semiconductor layer 36 may be etched to form a channel between the source electrode 401 and the drain electrode 402 by using the patterned second metal layer 40 as a mask.

After that, a passivation layer 42 and a planar layer 44 are formed to cover the patterned semiconductor layer 36, the patterned second metal layer 40, and the first insulating layer 34. Then, the passivation layer 42 and the planar layer 44 are patterned by the photolithography and etching methods to form a plurality of through holes 52, 54. In the present embodiment, among the plural through holes 52, 54, at least one through hole extends through the planar layer 44 and the passivation layer 42, so as to expose the top electrode 403 of the auxiliary capacitor. The through hole 52 serves as the contact of the drain electrode 402 for the thin film transistor. In addition, at least one through hole 54 may extend through the planar layer 44, the passivation layer 42, the semiconductor layer 36, and the first insulating layer 34, and thereby expose the terminal pad 323 outside of the display area to serve as a contact of the terminal pad. In the present embodiment, it is also possible to form the passivation layer 42 only, the planar layer 44 only, or both the passivation layer 42 and the planar layer 44. If both the passivation layer 42 and the planar layer 44 are formed, the sequence of the passivation layer 42 and the planar layer 44 is not limited.

Finally, a transparent electrode layer 46 is formed on the planarization 44 for acting as a pixel electrode. The transparent electrode layer 46 may be made of indium tin oxide (ITO) or indium zirconium oxide (IZO).

In the present embodiment, the same mask can be used to carry out the first and the second photolithography and etching processes due to the coincidence of the pattern between the first metal layer 32 and the semiconductor layer 36 (the ohmic contact layer 38). Therefore, the design and manufacturing cost of the omitted mask can be saved.

Alternatively, taking the patterned first metal layer 32 as the mask in carrying out the second photolithography and etching process can also omit one mask. As a result, the present embodiment can enable manufacture of a bottom substrate through five lithography processes cycles with only four masks. Thus, the cost of a liquid crystal display device can be reduced due to the absence of the manufacturing cost of one mask.

Although the present invention has been explained in relation to its embodiment, it is to be understood that many other possible modifications and variations can be made without departing from the scope of the invention as hereinafter claimed.

What is claimed is:

1. A method for manufacturing a bottom substrate of a liquid crystal display, comprising the steps of:
   (A) providing a substrate;
   (B) forming a patterned first metal layer on the substrate by using a first mask;
   (C) forming a first insulating layer on the patterned first metal layer and the substrate;
   (D) forming a patterned semiconductor layer on the first insulating layer by using the first mask, wherein the semiconductor layer is formed above the first metal layer;
   (E) forming a patterned second metal layer on the patterned semiconductor layer;
   (F) forming a second insulating layer on the patterned second metal layer, the semiconductor layer and the first insulating layer, and then patterning the second insulating layer; and
   (G) forming a transparent electrode layer on the second insulating layer and then patterning the transparent electrode layer.

2. The method of claim 1, wherein the second insulating layer includes a passivation layer and a planar layer.

3. The method of claim 1, wherein the semiconductor layer is an amorphous silicon layer.

4. The method of claim 1, further comprising a step of forming an ohmic contact layer on the patterned semiconductor layer.

5. The method of claim 4, wherein the ohmic contact layer is an $N^+$ amorphous silicon layer.

6. The method of claim 1, wherein the second insulating layer has a plurality of through holes.

7. The method of claim 6, wherein at least one through hole extends through the second insulating layer, the semiconductor layer, and the first insulating layer for exposing the patterned first metal layer.

8. The method of claim 7, wherein at least one through hole extends through the second insulating layer for exposing the patterned second metal layer.

9. The method of claim 1, wherein part of the patterned first metal layer is a gate electrode of a thin film transistor.

10. The method of claim 1, wherein part of the patterned first metal layer is an electrode of an auxiliary capacitor.

11. The method of claim 1, wherein part of the patterned first metal layer is a terminal pad outside of a display area.

12. The method of claim 1, wherein part of the patterned second metal layer is a source electrode or a drain electrode of a thin film transistor.

13. The method of claim 1, wherein the substrate is a glass substrate.

14. The method of claim 1, wherein the first insulating layer is made of silicon oxide or silicon nitride.

15. The method of claim 1, wherein the transparent electrode layer is made of indium zirconium oxide (IZO) or indium tin oxide (ITO).

16. A method for manufacturing a bottom substrate of a liquid crystal display, comprising the steps of:
   (A) providing a substrate;
   (B) forming a patterned first metal layer on the substrate by using a first mask;
   (C) forming a first insulating layer on the patterned first metal layer and the substrate;
   (D) forming a patterned semiconductor layer on the first insulating layer by using the patterned first metal layer as a mask, wherein the semiconductor layer is formed above the first metal layer;
   (E) forming a patterned second metal layer on the patterned semiconductor layer;
   (F) forming a second insulating layer on the patterned second metal layer, the semiconductor layer and the first insulating layer, and then patterning the second insulating layer; and
   (G) forming a transparent electrode layer on the second insulating layer and then patterning the transparent electrode layer.

17. The method of claim 16, wherein the second insulating layer includes a passivation layer and a planar layer.

18. The method of claim 16, further comprising a step of forming an ohmic contact layer on the patterned semiconductor layer.

19. The method of claim 16, wherein the second insulating layer has a plurality of through holes.

* * * * *